(12) United States Patent
Huang et al.

(10) Patent No.: US 9,171,944 B2
(45) Date of Patent: Oct. 27, 2015

(54) SELF-ADAPTIVE COMPOSITE TUNNELING FIELD EFFECT TRANSISTOR AND METHOD FOR FABRICATING THE SAME

(71) Applicant: Peking University, Beijing (CN)

(72) Inventors: Ru Huang, Beijing (CN); Qianqian Huang, Beijing (CN); Zhan Zhan, Beijing (CN); Yingxin Qiu, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 177 days.

(21) Appl. No.: 14/117,007

(22) PCT Filed: Apr. 27, 2013

(86) PCT No.: PCT/CN2013/074876
§ 371 (c)(1),
(2) Date: Nov. 11, 2013

(87) PCT Pub. No.: WO2013/166927
PCT Pub. Date: Nov. 14, 2013

(65) Prior Publication Data
US 2015/0236139 A1    Aug. 20, 2015

(30) Foreign Application Priority Data

May 8, 2012    (CN) .......................... 2012 1 0139560

(51) Int. Cl.
*H01L 29/06*    (2006.01)
*H01L 29/66*    (2006.01)
(Continued)

(52) U.S. Cl.
CPC ........ *H01L 29/66977* (2013.01); *H01L 21/266* (2013.01); *H01L 21/26513* (2013.01);
(Continued)

(58) Field of Classification Search
CPC ............ H01L 29/7391; H01L 29/0847; H01L 29/0649
USPC ............................................................. 257/9
See application file for complete search history.

(56) References Cited

U.S. PATENT DOCUMENTS 6,937,516 B2 *    8/2005    Fazan et al. .............. 365/185.14
2007/0178650 A1 *    8/2007    Chen et al. .................... 438/301
(Continued)

FOREIGN PATENT DOCUMENTS

CN          102194884 A        9/2011
CN          102201450 A        9/2011
WO      WO 2012/051824 A1     4/2012

OTHER PUBLICATIONS

Huang, Q. et al. (2011) "Self-Depleted T-gate Schottky Barrier Tunneling FET with Low Average Subthreshold Slope and High ION/IOFF by Gate Configuration and Barrier Modulation," IEDM, 2011 IEEE International:382-385.

(Continued)

*Primary Examiner* — Douglas Menz
(74) *Attorney, Agent, or Firm* — Foley & Lardner LLP; Antoinette F. Konski

(57) ABSTRACT

The present invention provides a tunneling field effect transistor and a method for fabricating the same which refer to a field effect transistor logic device and circuit in a CMOS ultra-large integrated circuit (ULSI). The inventive concept of the invention lies in that, in a case of an N-type transistor, a side portion of a doped source region adjacent to an edge of the control gate is further implanted with P+ impurities on a basis of the doped source region being initially doped N– impurities, so that the initial N– impurities in the implanted portion are completely compensated by the P+ impurities, and in a case of a P-type transistor, a side portion of the doped source region adjacent to an edge of the control gate is implanted with N+ impurities on a basis of the doped source region being initially doped P– impurities, so that the initial P– impurities in the implanted portion are completely compensated by the N+ impurities. In the transistor, the source region is implanted twice with different doping concentrations, such that a large current characteristic of the MOSFET can be effectively combined to increase an on-state current of the transistor, and also, the threshold adjustment for the MOSFET portion and the TFET portion of the transistor can be achieved in a self-adaptive way.

9 Claims, 3 Drawing Sheets

(51) Int. Cl.
*H01L 29/739* (2006.01)
*H01L 29/08* (2006.01)
*H01L 21/265* (2006.01)
*H01L 21/266* (2006.01)
*H01L 21/324* (2006.01)
*H01L 21/28* (2006.01)

(52) U.S. Cl.
CPC .... *H01L21/28194* (2013.01); *H01L 21/28202* (2013.01); *H01L 21/28211* (2013.01); *H01L 21/324* (2013.01); *H01L 29/0649* (2013.01); *H01L 29/0847* (2013.01); *H01L 29/66325* (2013.01); *H01L 29/7391* (2013.01)

(56) References Cited

U.S. PATENT DOCUMENTS

2010/0200916 A1    8/2010   Gossner et al.
2011/0084319 A1*   4/2011   Zhu et al. .................. 257/288
2012/0018743 A1    1/2012   Hiyoshi et al.
2012/0313154 A1*  12/2012   Huang et al. ............... 257/288
2013/0161696 A1*   6/2013   Verhulst et al. ............ 257/192

OTHER PUBLICATIONS

Zhuge, J. et al. (2011) "Digital-circuit analysis of short-gate tunnel FETs for low-voltage applications," Semicond. Sci. Technol., 26:085001-085008.

International Search Report and Written Opinion for International Application No. PCT/CN2013/074876, mailed Aug. 1, 2013, 14 pages.

* cited by examiner

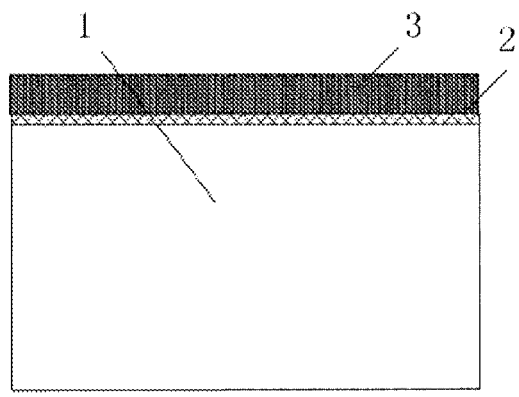
Fig.1
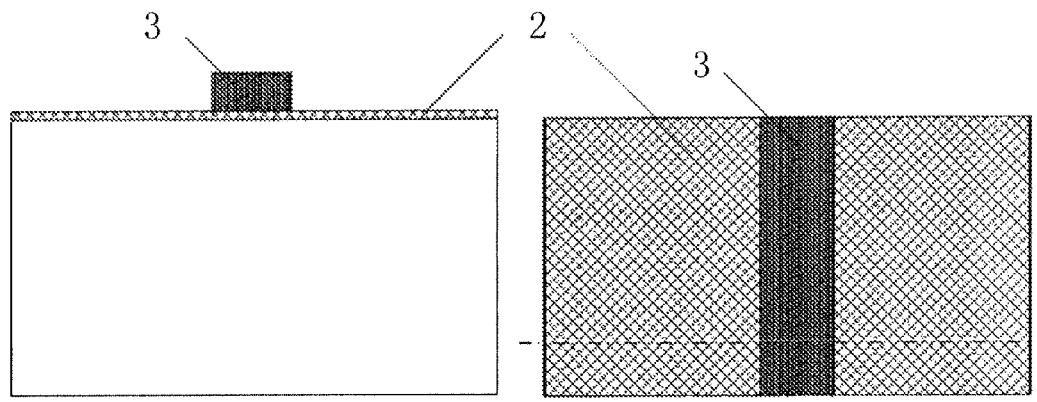
Fig.2a                    Fig.2b

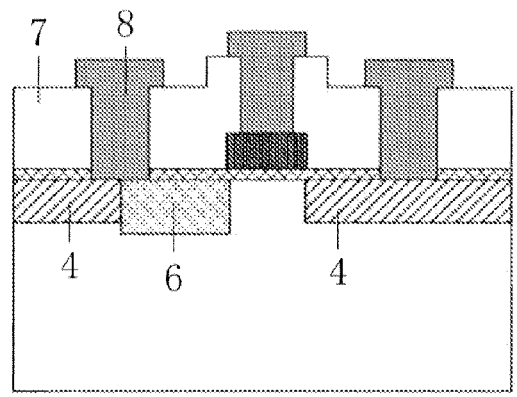
Fig.5
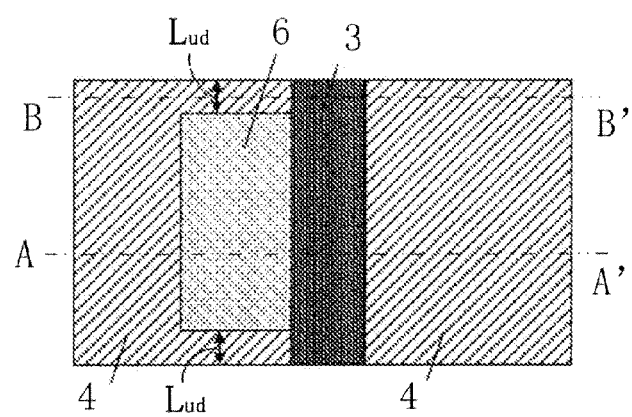
Fig.6
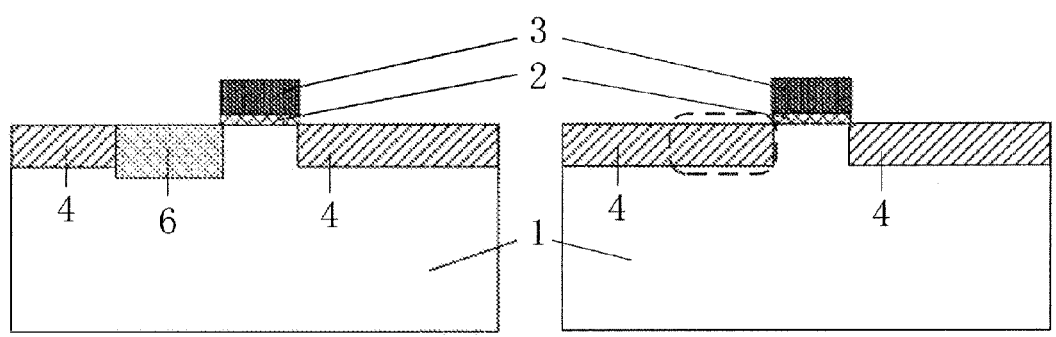
Fig.7a                              Fig.7b

SELF-ADAPTIVE COMPOSITE TUNNELING FIELD EFFECT TRANSISTOR AND METHOD FOR FABRICATING THE SAME

CROSS REFERENCE TO RELATED APPLICATIONS

The present application is a national stage application under 35 U.S.C. §371 of International Application No. PCT/CN2013/074876, filed Apr. 27, 2013, which in turn claims priority to Chinese application No. 201210139560.6, filed May 8, 2012, the contents of each of which are incorporated herein by reference in their entireties.

FIELD OF THE INVENTION

Then present invention refers to a field effect transistor logic device and circuit in a CMOS ultra large integrated circuit (ULSI), and in particular, refers to a tunneling field effect transistor (TFET) by effectively combining with a current of a metal-oxide-silicon field effect transistor (MOSFET) in a self-adaptive way and a method for fabricating the same.

BACKGROUND OF THE INVENTION

With the size of a MOSFET shrinks, the device is subjected to even more severe negative effects such as a short channel effect of the device and etc. after entering a nanometer scale, which causes an off-state leakage current of device increase. Meanwhile, since a subthreshold slope of a conventional MOSFET is limited by the thermoelectric potential and thus cannot be reduced synchronously as the size of device decreases, there is a theoretical limit at 60 mV/dec, causing that the leakage current further increases as the reduction of the supply voltage, and thereby increasing the power consumption of the device. The power consumption issue has now become one of the most serious problems in limiting the scaling down of the device.

In the field of ultra-low voltage and power consumption, a device using a new switching mechanism to obtain ultra-steep subthreshold slope and a process method for fabricating the same has become a focus of attention in recent years. Since such device is not restricted by the thermoelectric potential and thus can break the subthreshold slope limit of the conventional MOSFET, and thus has great advantages when applied into in the low power device. Among them, a tunneling field effect transistor (TFET) has attracted widespread attentions due to a very low leakage current and an ultra steep subthreshold slope. Unlike the conventional MOSFET, doping types of a source and a drain of the TFET are opposite to each other, the TFET can be turned on by a band-to-band tunneling of a reverse-biased P-I-N junction under control of a gate, and thus it can operate at a lower voltage, thus is suitable for being applied into the field of low voltage and low power consumption. However, the TFET faces a problem of a small on-state current due to constraints in the tunneling probability and tunneling area of a source junction, which is far less desirable than that of traditional MOSFET. Moreover, the TFET has an ambipolar effect, greatly limiting the application of the TFET.

SUMMARY OF THE INVENTION

An object of the present invention is to provide a tunneling field effect transistor with a composite mechanism by combining a current of a MOSFET in a self-adaptive way and a method for fabricating the same. The transistor of the invention can be completely compatible with the conventional CMOS process, a turning-on current of the TFET can be dramatically increased and a steeper subthreshold characteristics can be obtained while an ambipolar effect can be suppressed.

A technical solution of the present invention is described as follow.

A tunneling field effect transistor according to the present invention includes a control gate, a gate dielectric layer, a semiconductor substrate, a doped source region and a doped drain region. The doped source region and the doped drain region are located at both sides of the control gate, respectively. The transistor is characterized in that, in a case of the transistor being an N-type (or a P-type) transistor, the doped source region comprises two parts, that is, a $P^+$ (or $P^-$) doped region and an $N^-$ (or $N^+$) doped region. In particular, as shown in FIG. 6, in a case of the transistor being an N-type transistor, the drain region includes a $N^-$ doped (with a concentration of about $1\times10^{19}\sim\times1\times10^{20}$ cm$^{-3}$) region, the source region is further implanted with $P^+$ impurities (with a concentration of about $1\times10^{20}\sim1\times10^{21}$ cm$^{-3}$) on a basis of $N^-$ doping at a side portion close to an edge of the control gate, so that the initial $N^-$ doping in the implanted side portion is completely compensated as a $P^+$ doping, and there are certain intervals $L_{ud}$ between both sides of the side portion and edges of an active region (the interval $L_{ud}$ is smaller than a depletion width depending on the doping concentration, and less than 2 μm). In a case of the transistor being a P-type transistor, the drain region comprises a $P^-$ doped (with a concentration of about $1\times10^{19}\sim1\times10^{20}$ cm$^{-3}$) region, the source region is further implanted with $N^+$ impurities (with a concentration of about $1\times10^{20}\sim1\times10^{21}$ cm$^{-3}$) on a basis of $P^-$ doping at a side portion close to an edge of the control gate, so that the initial $P^-$ doping in the implanted side portion is completely compensated as a $N^+$ doping, and there are certain intervals $L_{ud}$ between both sides of the side portion and edges of the active region (the interval $L_{ud}$ is smaller than the depletion width depending on the doping concentration, and is less than 2 μm).

A method for fabricating the above-mentioned tunneling field effect transistor includes following steps:

(1) Defining an active region on a semiconductor substrate through a shallow trench isolation process;

(2) Growing a gate dielectric layer;

(3) Depositing a gate material and then performing a photolithography process and an etching process to form a pattern of a control gate;

(4) Performing a self-alignment ion implantation process by using the control gate as a mask, so as to form a doped drain region and a doped source region having the same doping type and concentration of about $1\times10^{19}\sim1\times10^{20}$ cm$^{-3}$;

(5) Exposing a portion of the doped source region connected to the control gate through a photolithography process, implanting impurities by using a photoresist and the control gate as a mask to form a highly doped source region of another doping type with a concentration of about $1\times10^{20}\sim1\times10^{21}$ cm$^{-3}$, and then performing a high temperature rapid annealing to activate the impurities;

(6) Performing conventional subsequent CMOS processes, including a deposition of a passivation layer, an opening of contact holes and a metallization process, etc. As such, said tunneling field effect transistor is fabricated. It is noted that each of the contact holes for the source region should cover the two types of impurities in the source region.

In the above-mentioned method, in the step (1), a material of the semiconductor substrate is selected from Si, Ge, SiGe, GaAs, other binary or ternary compound semiconductor of groups II-VI, III-V and IV-IV, silicon on insulator (SOI) or germanium on insulator (GOI).

In the above-mentioned method, in the step (2), a material of the gate dielectric layer is selected from $SiO_2$, $Si_3N_4$ and high-k dielectric material.

In the above-mentioned method, in the step (2), a method for growing the gate dielectric layer is selected from one of following methods: regular thermal oxidation, nitrating thermal oxidation, chemical vapor deposition and physical vapor deposition.

In the above-mentioned method, in the step (3), the gate material is selected from doped polysilicon, metal cobalt, metal nickel and other metals or metal silicides.

A technical effect of the present invention is described as follow.

I. An asymmetric TFET structure having good performance can be formed through the secondarily highly doped region in the source region, the relatively lightly doped drain region and the control gate. On one hand, since the secondary doping for the source region is a high doping implantation, the preliminarily doped impurities can be effectively compensated and thus impurities having an opposite doping type can be formed so as to form the TFET structure. Furthermore, since the types of the preliminarily and secondarily doped impurities are opposite to each other, a concentration gradient at a tunneling junction of the TFET can become steeper due to a depletion effect and thus facilitate a band-to-band tunneling, so that a steeper subthreshold slope and a higher on-state current compared with the conventional TFET can be obtained. On the other hand, since the doping in the drain region is achieved during the preliminary self-alignment implantation, the doping concentration of the drain region is relatively low, so that an ambipolar effect occurred in the conventional TFET can be effectively inhibited and an ambipolar turning-on current can be suppressed. Therefore, the design of the preliminarily and secondarily implantations by using different concentrations and doping at different locations can obtain a steeper subthreshold characteristic while suppressing the ambipolar effect of the TFET.

II. A design that the secondarily doped region is spaced apart from the edges of the active region in a width direction at a certain interval can effectively introduce the trait of MOSFET to the transistor according to the invention. On one hand, in the transistor of the invention, a MOSFET is formed through a portion of the source region that is not implanted by the secondary doping, the control gate and the drain source. Thus, such structure can obtain much higher turning-on current than that of the conventional TFET in the same area of the active region. On the other hand, since the interval is smaller than the depletion width, an energy band at a source junction of the MOSFET portion is raised up, so that the MOSFET portion is not easily to be turned on. Thus, under a condition that steps of processes are not increased, the TFET portion can be turned on earlier than the MOSFET portion through simple layout designs by automatically adjusting threshold voltages of the TFET and the MOSFET. As such, the subthreshold characteristic of the transistor can be determined by the TFET so that it is not limited by the subthreshold slope limitation of the conventional MOSFET. Therefore, the transistor combines the advantages of the conventional TFET and MOSFET very well, a better subthreshold characteristic and a higher on-state current can be obtained, so that the transistor can self-adaptively achieve a composite mechanism combination.

III. The transistor according to the invention has simple fabrication processes, which are completely compatible with the conventional MOSFET processes. The performance of the transistor can be greatly enhanced without increasing the area of the active region and the process complexity.

In short, the transistor according to the invention employs a design that the source region is doped with two different concentrations and a certain interval is left with respect to locations, a trait of the large turning-on current in the MOSFET can be effectively combined to increase the on-state current of the transistor according to the invention, and a threshold adjustment for the MOSFET portion and the TEFT portion can be achieved in a self-adaptive way. When compared with the conventional TFET, a higher turning-on current and a lower subthreshold slope can be obtained by the transistor of the invention under the same process condition and the same size of the active region, so that it can be used in low power applications. Thus, the transistor according to the invention has a high practical value.

BRIEF DESCRIPTION OF THE DRAWINGS

FIG. 1 is a schematic view showing processes for growing a gate dielectric layer and depositing a gate material on a semiconductor substrate;

FIG. 2a is a cross-section view taken along a dotted line direction of FIG. 2b, showing a control gate in the transistor formed after a photolithography process and an etching process, and FIG. 2b is a top view of the transistor;

FIG. 5 is a cross-section view taken along the dotted line direction of FIG. 4b, showing the transistor subjected to subsequent processes (formation of contact holes and metallization);

FIG. 6 is a top view of a self-adaptive composite tunneling field effect transistor according to the present invention.

FIG. 7a is a cross-section view of the tunneling field effect transistor according to the present invention taken along a direction of AA' in FIG. 6;

FIG. 7b is a cross-section view of the tunneling field effect transistor according to the present invention taken along a direction of BB' in FIG. 6, in which a portion indicated by a dotted line is a depleted doping portion;

Figure 3:
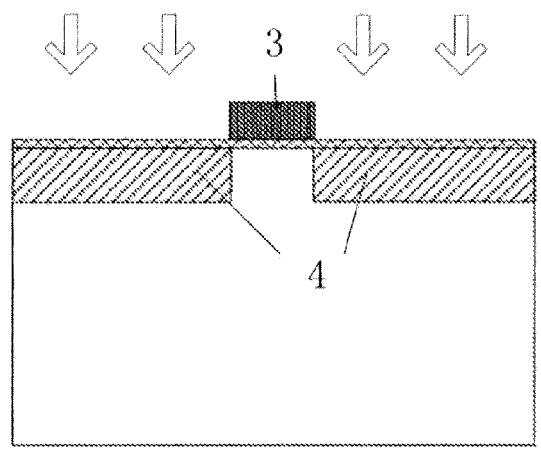
FIG. 3 is a cross-section view showing a source region and a drain region in the transistor both with relatively low doping concentration formed after a self-alignment ion implantation process.

In the drawings:
1—a semiconductor substrate
2—a gate dielectric layer
3—a gate
4—a source region and a drain region both with relatively low doping concentration
5—a photoresist
6—a highly doped source region of an opposite doping type
7—a passivation layer in subsequent processes
8—a metal in a subsequent processes

DETAILED DESCRIPTION OF THE EMBODIMENTS

Hereinafter, the present invention will be further described through examples. It is noted that the embodiment is disclosed for the purposes of further understanding of the present invention. However, it is appreciated to those skilled in the art that various substitutions and modifications are possible without departing from the spirit and scope of the invention and the accompanying claims. Therefore, the present invention is not limited to the disclosure of the embodiments, but based on the scope defined by the claims.

An embodiment of the fabrication method according to the present invention includes processes shown in FIG. 1 to FIG. 4b.

1. As shown in FIG. 1, an isolation layer for an active region is fabricated by using a shallow isolation technology on a bulk silicon wafer substrate 1, which has a crystal orientation of (100). The substrate is lightly doped. Subsequently, a gate dielectric layer 2 is grown by a thermal growth process. The gate dielectric layer 2 is $SiO_2$ and has a thickness of 1~5 nm. Then, a gate material 3 is deposited. The gate material is doped polysilicon and has a thickness of 150~300 nm.

2. As shown in FIGS. 2a and 2b, a pattern of a control gate is formed by performing a photolithography process. Then, the gate material 3 is etched down to the gate dielectric layer 2.

3. As shown in FIG. 3, $P^-$ ions are implanted through a self-alignment ion implantation process by using the control gate 3 as a mask, so as to form a source region and a drain region 4 both with a relatively low doing concentration. In the ion implantation process, an energy for the implantation is 40 keV, a dose is 1e14, and implanted impurities are $BF_2^{+*}$.

Figures 4A, 4B:
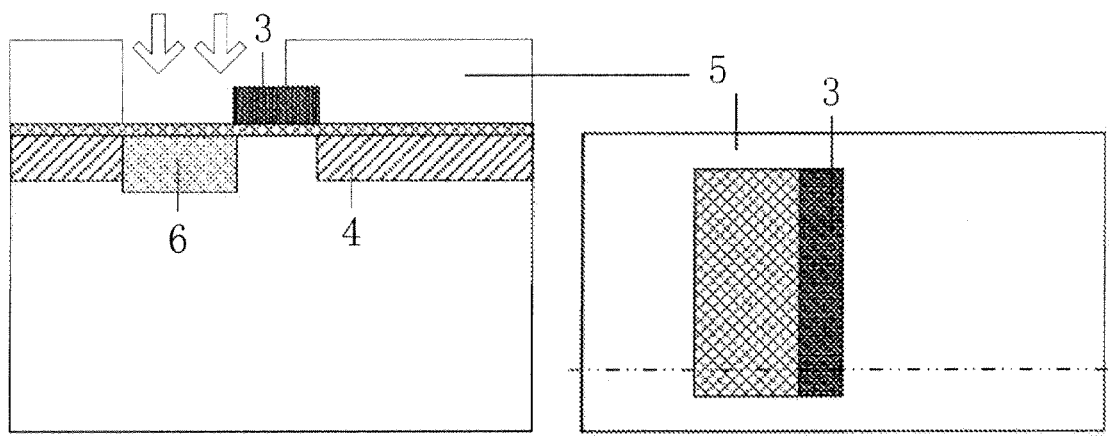
FIG. 4a is a cross-section view taken along a dotted line direction of FIG. 4b, showing a highly doped source region of an opposite doping type in the transistor, formed after a portion of the source region connected to the control gate is exposed by a photolithography process and implanted with impurities.
FIG. 4b is a top view of the transistor.

4. As shown in FIGS. 4a and 4b, a pattern of a portion of the source region connected to the control gate is exposed by using a photolithography process. Both sides of the pattern are spaced apart from edges of the active region at a certain interval, which is about 1 μm. $N^+$ ions are implanted through an ion implantation process by using a photoresist 5 and the control gate 3 as masks, so that a highly doped $N^+$ source region 6 is formed. In the ion implantation, an energy is 50 keV, a dose is 1e15, and implanted impurities are $As^+$. Then, a high temperature rapid annealing is performed once, so that the impurities implanted into the source region and the drain region are activated.

5. As shown in FIG. 5, conventional CMOS processes are subsequently performed. The processes include a deposition of a passivation layer 7, an opening of contact holes, and a metallization 8. As such, the self-adaptive composite tunneling field effect transistor according to the present invention can be fabricated.

While the present invention has been disclosed above with a preferable embodiment, it is not intended to limit the invention. Those skilled in the art can make various possible changes and modifications to the invention or modify it to equivalent embodiments based on the method and content disclosed above without departing from the scope of the present invention. Therefore, any changes, equivalents and modifications that based on the technical essence of the present invention without departing from the invention will fall into the scope of the present invention.

What is claimed is:

1. A tunneling field effect transistor, comprising a control gate, a gate dielectric layer, a semiconductor substrate, a doped source region and a doped drain region, the doped source region and the doped drain region being located at both sides of the control gate, respectively, characterized in that, in a case of an N-type transistor, a side portion of the doped source region adjacent to an edge of the control gate is further implanted with $P^+$ impurities on a basis of the doped source region being initially doped $N^-$ impurities, so that the initial $N^-$ impurities in the implanted portion are completely compensated by the $P^+$ impurities, and the portion doped with the $P^+$ impurities is spaced apart from edges of an active region in a width direction, and in a case of a P-type transistor, a side portion of the doped source region adjacent to an edge of the control gate is further implanted with $N^+$ impurities on a basis of the doped source region being initially doped $P^-$ impurities, so that the initial $P^-$ impurities in the implanted portion are completely compensated by the $N^+$ impurities, and the portion doped with $N^+$ impurities is spaced apart from edges of an active region in a width direction.

2. The tunneling field effect transistor of claim 1, wherein, in the case of the N-type transistor, a doping concentration of the $N^-$ impurities in the doped drain region is $1\times10^{19}$~$1\times10^{20}$ $cm^{-3}$, and a doping concentration of the $P^+$ impurities is $1\times10^{20}$~$1\times10^{21}$ $cm^{-3}$.

3. The tunneling field effect transistor of claim 1, wherein, in the case of the P-type transistor, a doping concentration of the $P^-$ impurities in the doped drain region is $1\times10^{19}$~$1\times10^{20}$ $cm^{-3}$, and a doping concentration of the $N^+$ impurities is $1\times10^{20}$~$1\times10^{21}$ $cm^{-3}$.

4. The tunneling field effect transistor of claim 1, wherein an interval between edges of the $P^+$ impurities portion or the $N^+$ impurities portion and the edges of the active region in the width direction is less than 2 μm.

5. A method for fabricating the tunneling field effect transistor of claim 1, comprising:
   (1) Defining an active region on a semiconductor substrate through a shallow trench isolation process;
   (2) Growing a gate dielectric layer;
   (3) Depositing a gate material and then performing a photolithography process and an etching process to form a pattern of a control gate;
   (4) Performing a self-alignment ion implantation process by using the control gate as a mask, so as to form a doped drain region and a doped source region having the same doping type;
   (5) Exposing a portion of the doped source region connected to the control gate through a photolithography process, implanting impurities at the portion adjacent to an edge of the control gate by using a photoresist and the control gate as a mask to form a highly doped source region of another doping type, and then performing a high temperature rapid annealing to activate the impurities;
   (6) Performing conventional subsequent CMOS processes.

6. The method of claim 5, wherein, in the step (1), a material of the semiconductor substrate is selected from Si, Ge, SiGe, GaAs, other binary or ternary compound semiconductor of groups II-VI, III-V and IV-IV, silicon on insulator or germanium on insulator.

7. The method of claim 5, wherein, in the step (2), a material of the gate dielectric layer is selected from $SiO_2$, $Si_3N_4$ and high-k dielectric material.

8. The method of claim 5, wherein a method for growing the gate dielectric layer is selected from one of following methods: regular thermal oxidation, nitrating thermal oxidation, chemical vapor deposition and physical vapor deposition.

9. The method of claim 5, wherein, in the step (3), the gate material is selected from doped polysilicon, metal cobalt, metal nickel and other metals or metal silicides.

* * * * *